United States Patent [19]

Tabatabaie

[11] Patent Number: 4,814,847
[45] Date of Patent: Mar. 21, 1989

[54] INGAAS SEMICONDUCTOR STRUCTURES

[75] Inventor: Nader Tabatabaie, Red Bank Boro, N.J.

[73] Assignee: Bell Communications Research, Inc., Livingston, N.J.

[21] Appl. No.: 139,379

[22] Filed: Dec. 30, 1987

Related U.S. Application Data

[62] Division of Ser. No. 933,148, Nov. 21, 1986, Pat. No. 4,729,963.

[51] Int. Cl.[4] .................. H01L 27/14; H01L 29/161; H01L 29/06
[52] U.S. Cl. ....................... 357/30; 357/13; 357/16; 357/52; 357/55
[58] Field of Search ............... 357/30 A, 30 B, 30 E, 357/30 M, 16, 13, 13 R, 13 V, 13 Z, 52, 55, 30 D, 30 F, 30 Q

[56] References Cited

U.S. PATENT DOCUMENTS

| | | | |
|---|---|---|---|
| 3,593,067 | 7/1971 | Flynn | 317/234 R |
| 3,604,987 | 9/1971 | Assour | 250/209 |
| 3,617,823 | 11/1971 | Hofstein | 317/235 |
| 3,689,900 | 9/1972 | Chen | 340/173 LM |
| 3,735,137 | 5/1973 | Bly | 250/83.3 HP |
| 3,792,258 | 2/1974 | Sliker | 250/213 A |
| 3,849,678 | 11/1974 | Flynn | 307/311 |
| 4,142,207 | 2/1979 | McCormack et al. | 358/113 |
| 4,143,269 | 3/1979 | McCormack et al. | 250/352 |
| 4,547,792 | 10/1985 | Sclar | 357/45 |

FOREIGN PATENT DOCUMENTS

| | | | |
|---|---|---|---|
| 55-72083 | 5/1980 | Japan | 357/30 A |
| 55-124278 | 9/1980 | Japan | 357/30 A |
| 58-162077 | 9/1983 | Japan | 357/30 A |
| 60-65580 | 4/1985 | Japan | 357/30 A |
| 61-191082 | 8/1986 | Japan | 357/30 A |
| 61-182272 | 8/1986 | Japan | 357/30 A |

Primary Examiner—J. Carroll
Assistant Examiner—Ngan V. Ngo
Attorney, Agent, or Firm—James W. Falk

[57] ABSTRACT

An InGaAs semiconductor device implemented on a semiconductor substrate having a first major surface on which active semiconductor devices are to be formed, and a second major surface. An etch stop layer is provided on the first major surface. A layer of semiconductor material is provided on the etch stop layer and portions of the substrate are selectively removed to provide a pattern of apertures in the layer extending to the etch stop layer. Dopant species are provided through the second major surface to form active regions in the layer of semiconductor material. The resulting structure permits the integration of optoelectronic devices with photoelectronic devices on the same substrate.

14 Claims, 2 Drawing Sheets

INGAAS SEMICONDUCTOR STRUCTURES

REFERENCES TO RELATED APPLICATIONS

This is a divisional application of copending U.S. patent application Ser. No. 933,148, filed Nov. 21, 1986 which is now U.S. Pat No. 4,729,963.

BACKGROUND OF THE INVENTION

1. Field of the Invention

The invention relates to semiconductor photoelectronic devices, and in particular to an InGaAs semiconductor structure permitting the integration of optoelectronic devices with electronic devices on the same substrate. One application for such integrated devices includes the direct interfacing to an optical fiber for information transmission and detection.

2. Description of the Prior Art

Various types of integrated optoelectronic circuits including an array of photodetector devices on one surface of a semiconductor body, and electronic access devices associated therewith on the same semiconductor body and methods of fabricating such structures are known in the prior art. Such circuits are typically implemented with the devices on one side of the array, and the access circuits on the other side. U.S. Pat. Nos. 3,849,678 and 4,547,792 disclose a photodetector array implemented on one side of a semiconductor wafer and an array of MOSFET switches on the other side of the wafer. U.S. Pat. Nos. 4,142,207 and 4,143,269 disclose an imaging system including a MOS field effect transistor switching matrix and a ferroelectric detector matrix located on opposite sides of a heat sink. Other U.S. Pat. Nos. 3,593,067 and 3,604,987 and 3,617,823 and 3,689,900 and 3,735,137 and 3,792,258 disclose various semiconductor devices in which active circuit elements are implemented on both sides of the semiconductor body.

Such detector configurations and imaging systems of the prior art use conventional planar semiconductor fabrication techniques and are directed to applications which are not associated with optical fiber transmission. Prior to the present invention, there has not been a method of fabricating an integrated circuit which permits the integration of low-noise high sensitivity detectors with high power amplifiers on the same semiconductor chip while allowing the performance of each element of the circuit to be optimized independently.

SUMMARY OF THE INVENTION

Briefly, and in general terms, the invention provides a semiconductor device including a semiconductor substrate having a first major surface on which active semiconductor devices are to be formed, and a second major surface. An etch stop layer is provided on the first major surface. A layer of semiconductor material is deposited on the etch stop layer. The second major surface of the substrate includes a pattern of apertures extending to the etch stop layer. Finally, a dopant species is provided through the second major surface to form active regions in the layer of semiconductor material.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawings.

DESCRIPTION OF THE PREFERRED EMBODIMENT

Until recently, planar fabrication technology has generally been limited to junction formation by way of dopant introduction (diffusion or ion-implantation) from the top surface of the epitaxially grown (or otherwise specially prepared) layers. In some cases, however, it may be more desirable to form junctions or other active elements of semiconductor devices by introducing the dopants through the back side of the wafer. A device fabricated in accordance with the present invention introduces dopants in a semiconductor body through wells etched in the backside of the supporting substrate. As will be discussed later, there are many advantages associated with the formation of such p-n-junctions, in particular in semiconductor devices such as photodetectors. A preferred embodiment of a semiconductor device formed by the device of the present invention is an avalanche photodetector (APD), and is used as an example to illustrate the sequence of fabrication steps in forming modified planar structures according to the present invention. The InGaAsP/InP alloy system is used here as the semiconductors for illustration. Furthermore, the present invention allows an opportunity for integrating optoelectronic devices of diverse nature on the same substrate. An example of an APD-JFET combination is also discussed. In the text that follows, the abbreviation APD is used for avalanche photodiode, and JFET is used for junction field effect transistor.

Figure 1:
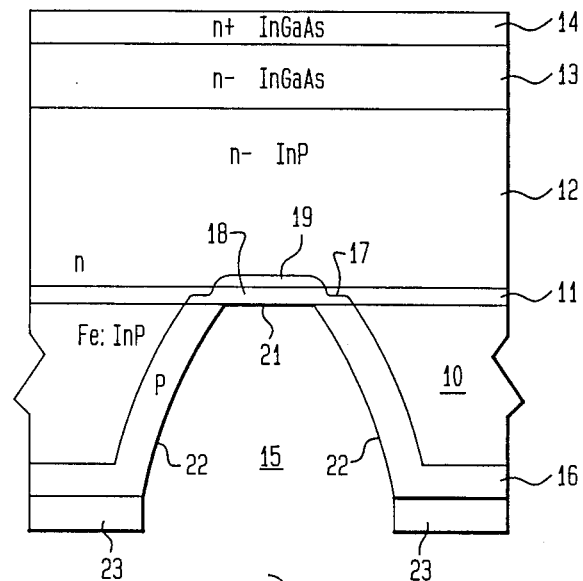
FIG. 1 shows a cross-sectional view of a semiconductor structure optoelectronic device according to the present invention.

The semiconductor structure according to the present invention may be grown by liquid phase epitaxy (LPE) techniques, although other fabrication techniques may be used as well to produce the sequence of epitaxially grown layers for fabricating the device according to the present invention. Turning to FIG. 1, in the preferred embodiment described herein, the device begins with a commercially available semi-insulating (Fe:InP) substrate 10, typically 500 microns in thickness. The first layer 11 is deposited on the substrate 10 and is a lattice-matched InGaAsP ($E_g=1.05$ eV) "etch-stop" layer. The purpose of layer 11 is to retard etching of the device in a later fabrication step according to the present invention. Layer 11 is grown to about 0.25 $\mu$m thickness and is undoped. A 5 $\mu$m InP layer 12, is then grown on the layer 11. The layer 12 is lightly doped to $5 \times 10^{15}$ cm$^{-3}$ and in the embodiment of a photoelectronic device constitutes the high-field region (multiplication region) of the APD to be formed.

As InGaAs layer 13 is deposited on layer 12. In the photoelectronic device, layer 13 is the light absorption region of the photodetector. The layer 13 is preferably grown to about 2 μm thick. Finally, the cap layer 14 is deposited on layer 13. Layer 14 is heavily doped ($N_d=5\times10^{17}$ cm$^{-3}$) lattice-matched InGaAs, 0.5 μm thick. Each of these layers 11, 12, 13 and 14 is successively grown on the top major surface of a semi-insulating InP substrate 10 using known device technology.

To fabricate the APD, the wafer is thinned to 80 μm by lapping and polishing the backside of the substrate using techniques known in the art. To protect the top surface during polishing, a 1000 Angstrom dielectric layer of $Si_3N_4$ is first deposited on the top surface prior to thinning the device. Another 1000 Angstrom layer of $Si_3N_4$ is deposited on the back surface following thinning. Using an infra-red mask aligner, the required photoresist patterns on the front and the back of the water are then aligned. The pattern on the back is an array of circular windows opened in the dielectric to facilitate etching the wells 15. The wells 15 are etched to within 10 μm of the etch-stop layer 11 by immersing the substrate in a 1% solution of Br in methanol. The substrate is then immersed in a selective etch solution of HCl to remove the approximately 10 or so microns stopping at the quaternary interface (i.e., the layer 11).

The next step is to define the areas on the back of the substrate to be Zn diffused for formation of active semiconductor device regions. A streets-and-avenues grid pattern may be defined around the wells 15 for this purpose. The $Si_3N_4$ grid is necessary in order to maintain single device isolation on the wafer. For production purposes in which the detectors are diced from the wafer and mounted separately no grid pattern is required. The nitride layer originally deposited on the top surface is sufficient to protect it during diffusion. Zn diffusion is typically performed in a quartz ampule with phosphorous overpressure.

The semiconductor body after providing dopant species through the major surface to provide regions of p-conductivity type is shown by reference numerals 16, 17, 18 and 19 in FIG. 1. The device of diffusion in the substrate is one of the important aspects of the present invention. The diffusion rate of Zn in the quaternary 18 is lower than that in the binary InP, so that the diffusion front will spread sideways around the perimeter of the device, resulting in a self-aligned guard ring around region 17 as shown in FIG. 1. The effect of such a ring is to smooth the electric field profile around the edges of the device and therefore eliminate edge breakdown. Conventional planar structures require a separately diffused guard ring for the same purpose, resulting in a more complex design. The thickness and the composition of the etch-stop layer 11 in the present invention can be varied in order to obtain the optimum diffusion profile for any given application.

Another desirable feature of the present invention is the lack of any exposed edges of the p-n junction. The junction is completely surrounded by semi-insulating InP which totally isolates the active areas of the device from the ambient. The conventional structures of the prior art suffer from surface leakage and time dependent degradation as a result of exposed junction edges. The next step according to the present invention is to provide ohmic contacts to the semiconductor regions.

Figure 2:
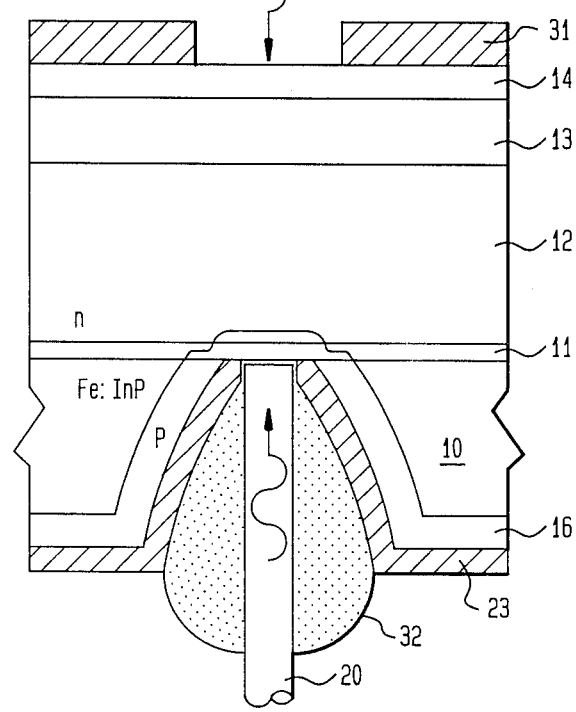
FIG. 2 shows the semiconductor structure of FIG. 1 subsequent to further steps including the attachment of a glass fiber.

Gold-zinc and gold-tin alloys are used for obtaining ohmic contacts to the top and the bottom of the device in the present invention such as layer 23 in FIG. 1 and layers 23 and 31 in FIG. 2. The dielectric layer on the top surface is removed everywhere except directly on top of the p-n junctions. Another lithography step is used to cover the very bottom of the etched wells. Au-Zn and Au-Sn is then plated and alloyed into the bottom and top surfaces respectively. The photoresist step on the bottom of the wells is repeated again and then a thick layer of gold (1 μm thick) is plated on both top and bottom surfaces.

The complete wafer will therefore have gold plated surfaces on both sides everywhere except directly over and under the center of the diffused p-n junction. In operation, the photoelectric device may be illuminated from either side of the junction.

Another embodiment of the present invention is shown in FIG. 2. Illumination from one side such as from beam 30 on one side and from a fiber 20 on the other side is all that is necessary. Backside illumination is preferred if the APD is to be used as a long-wavelength detector. Furthermore, the etched well of the device allows a technologically easy way to butt and glue in place an optical fiber 20 as shown in FIG. 2 against the surface 21 shown in FIG. 1.

Furthermore, it is possible to grow another set of active layers on the bottom side of the substrate 10. These layers can be grown so as to optimize the performance of devices which are incompatible with the ones fabricated on the top surface. One example is the integration of an APD with a JFET on the same chip. The APD requires a structure such as was described above, while a JFET needs a structure having a lightly doped InGaAs layer on a semi-insulating substrate. In order to integrate the two devices, the thinned wafer may be placed in the reactor tube of an epitaxial system, upside down, and another lattice-matched layer of InGaAs is grown on the backside. The source and drain of the JFET is then formed by n-type dopant ion implantation. Following the Si ion implantation, the fabrication steps are similar to what was previously described except for the n-type contacts which must be made to the source and the drain of the JFET. These contacts are formed by evaporating gold-tin eutectics after the Au-Sn and Au-Zn platings for the APD contacts.

Figure 3:
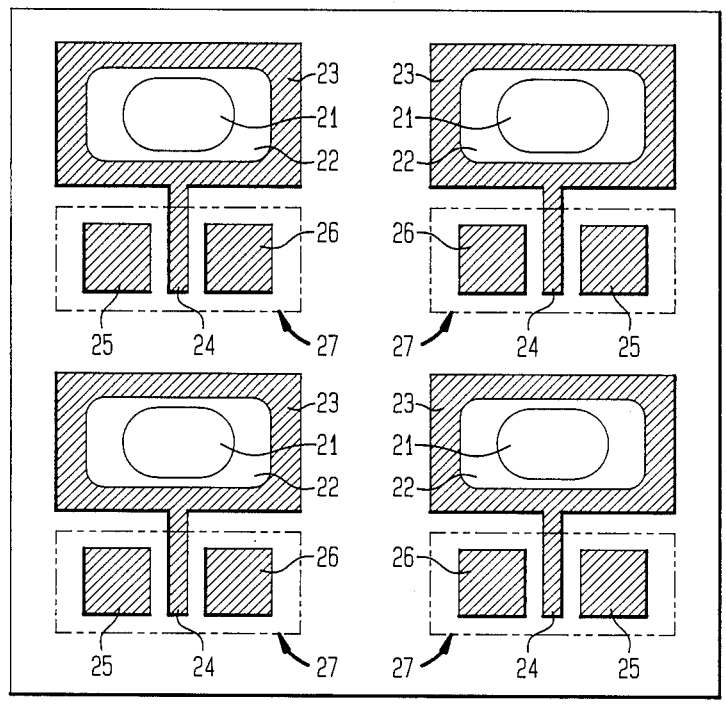
FIG. 3 shows a bottom plan view of a semiconductor body showing the implementation of optoelectronic and electronic devices according to the present invention.

FIG. 3 shows the bottom plan view of a portion of a completed wafer showing four APD-JFETS according to the present invention. In particular, there is illustrated the detector window surface 21, the sidewalls of the etched walls 22, and gold-plated contact regions 23-24, 25, and 26. The semiconductor region beneath the contact regions 23-24 along with regions 21 and 22 are converted to p-type conduction regions by the diffusion of the dopant Zn described earlier. The long finger, 24, forms the "gate" electrode of the JFET device and also serves as electrical connection between the JFET and the APD. Regions 25 and 26 are the "source" and the "drain" electrodes of the JFET respectively. Beneath these regions, silicon is ion implanted into the substrate 10 to form strongly n-type conduction regions. The entire shaded areas are covered by gold to facilitate electrical contact to the gate, source and drain of the JFET device.

This APD-JFET combination is intended as a low noise, high-speed, detector-amplifier device for use in fiber optics receiver circuits. The optical fiber is butted against the bottom surface 21 of the APD and glued in place using a low temperature epoxy resin 32 common to the art, as shown in FIG. 2. The light transmitted through the fiber and incident on the photodetector is absorbed and converted to electrical signals by the APD. These electrical signals are transferred to the JFET and are amplified there.

The ability to optimize the performance of both elements of the integrated detector-amplifier combination is one of the important attributes of this invention.

While the invention has been illustrated and described as embodied in an InGaAs a semiconductor structure, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that from the standpoint of prior art, fairly constitutes essential characteristics of the generic or specific aspects of this invention, and, therefore, such adaptations should and are intended to be comprehended within the meaning and range of equivalence of the following claims.

What is claimed is:

1. A semiconductor device comprising:
    a semiconductor substrate having a first major surface on which semiconductor devices are to be formed, and a second major surface;
    an epitaxially grown etch stop first layer disposed on said first major surface;
    a second layer composed of semiconductor material disposed epitaxially on said etch stop layer and including a dopant species provided through said second major surface and through said etch stop layer, thereby forming doped regions in said second layer of semiconductor material and respectively associated self-aligned guard rings in said etch stop layer, the diffusion rate of said dopant species in said etch stop layer being less than the diffusion rate of said dopant species in said second layer, and;
    apertures in said substrate extending to said etch stop layer, said dopant species being introduced into said etch stop layer and into said second layer via apertures.

2. A device as defined in claim 1 wherein said substrate is semi-insulating.

3. A device as defined in claim 1, wherein said substrate is Fe:InP.

4. A device as defined in claim 1 wherein said etch stop layer is InGaAsP.

5. A device as defined in claim 1 wherein said second layer composed of semiconductor material comprises InP.

6. A device as defined in claim 1, further comprising a third layer composed of semiconductor material disposed on said second layer of semiconductor material.

7. A device as defined in claim 6, wherein said third layer is composed of InGaAs.

8. A device as defined in claim 6, further comprising a fourth layer of semiconductor material disposed on said third layer of semiconductor material.

9. A device as defined in claim 8, wherein said fourth layer is composed of heavily doped InGaAs.

10. A device as defined in claim 1, wherein said dopant species provided in said second layer comprises Zn.

11. Semiconductor apparatus comprising:
    a substrate having first and second major surfaces,
    an etch stop layer on said first major surface,
    a layer of semiconductor material on said etch stop layer, first devices including said layer of semiconductor material formed overlying said first major surface,
    apertures in said substrate extending from said second major surface to but not through said etch stop layer, whereby a dopant species introduced into said apertures from said second major surface must traverse said etch stop layer to enter said layer of semiconductor material,
    and a dopant species in said etch stop layer and in said layer of semiconductor material in alignment with each of said apertures, the diffusion rate of said dopant species in said etch stop layer being less than the diffusion rate of said dopant species in said layer of semiconductor material, whereby a doped region is formed in said layer of semiconductor material in alignment with each aperture and a respectively associated self-aligned doped guard-ring region is formed in said etch stop layer.

12. Apparatus as in claim 11 further including a layer of semiconductor material in the second major surface of said substrate, and second devices formed in said layer of semiconductor material that is formed in second major surface of said substrate.

13. Apparatus as in claim 12 further including means interconnecting said first and second devices.

14. Apparatus as in claim 13 wherein said first devices comprise avalanche photodiodes and said second devices comprise junction field-effect transistors.

* * * * *

UNITED STATES PATENT AND TRADEMARK OFFICE
CERTIFICATE OF CORRECTION

PATENT NO. : 4,814,847

DATED : March 21, 1989

INVENTOR(S) : N. Tabatabaie

It is certified that error appears in the above-identified patent and that said Letters Patent is hereby corrected as shown below:

Column 2, line 6, before "optoelectronic" insert --comprising an--.
Column 3, line 15, "water" should read --wafer--.

Signed and Sealed this

Tenth Day of December, 1991

Attest:

HARRY F. MANBECK, JR.

*Attesting Officer*  *Commissioner of Patents and Trademarks*